(12) United States Patent
Tang

(10) Patent No.: US 12,419,028 B2
(45) Date of Patent: Sep. 16, 2025

(54) SEMICONDUCTOR STRUCTURE AND METHOD FOR FORMING SAME

(71) Applicant: CHANGXIN MEMORY TECHNOLOGIES, INC., Hefei (CN)

(72) Inventor: Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 512 days.

(21) Appl. No.: 17/951,017

(22) Filed: Sep. 22, 2022

(65) Prior Publication Data

US 2023/0018059 A1 Jan. 19, 2023

Related U.S. Application Data

(63) Continuation of application No. PCT/CN2022/102507, filed on Jun. 29, 2022.

(30) Foreign Application Priority Data

Jun. 10, 2022 (CN) .......................... 202210656240.1

(51) Int. Cl.
 *H10B 12/00* (2023.01)
(52) U.S. Cl.
 CPC ........... *H10B 12/05* (2023.02); *H10B 12/033* (2023.02); *H10B 12/315* (2023.02); *H10B 12/482* (2023.02)
(58) Field of Classification Search
 CPC .... H10B 12/05; H10B 12/033; H10B 12/315; H10B 12/482; H10B 12/0335; H10B 12/485; H10D 30/025; H10D 30/63; H10D 64/252; H10D 62/822
 See application file for complete search history.

(56) References Cited

U.S. PATENT DOCUMENTS

| 8,143,121 B2 * | 3/2012 | Lin ...................... H10B 12/053 438/257 |
| 9,929,152 B2 * | 3/2018 | Anderson ............. H10D 84/83 |
| 10,373,956 B2 | 8/2019 | Gupta |

(Continued)

FOREIGN PATENT DOCUMENTS

TW 201347164 A 11/2013

OTHER PUBLICATIONS

Zhu Ming, et al. "Development of floating body effect in SOI MOSFET's", Journal of Functional Materials and Devices, vol. 8, No. 3, Sep. 2002.

(Continued)

*Primary Examiner* — David Vu
(74) *Attorney, Agent, or Firm* — Kilpatrick Townsend & Stockton LLP

(57) ABSTRACT

Embodiments of the disclosure provide a semiconductor structure and a method for forming the same. The method includes: providing a semiconductor substrate including a plurality of active pillars arranged at intervals; etching the active pillar to form an annular groove, in which the annular groove does not expose a top surface and a bottom surface of the active pillar; and forming a first semiconductor layer in the annular groove to form the semiconductor structure; in which a band gap of the first semiconductor layer is smaller than a band gap of the active pillar.

20 Claims, 22 Drawing Sheets

(56) References Cited

U.S. PATENT DOCUMENTS

2020/0365612 A1   11/2020   Hu et al.

OTHER PUBLICATIONS

Mamoru Terauchi, et al. "Suppression of the Floating-Body Effects in SOI MOSFETs by Bandgap Engineering", Symposium on VLSI Technology Digest of Technical Papers, 1995.
Taiwan Patent Office, Office Action Issued in Application No. 112120329, Apr. 19, 2024, 2 pages.

* cited by examiner

# SEMICONDUCTOR STRUCTURE AND METHOD FOR FORMING SAME

CROSS-REFERENCE OF RELATED APPLICATION

This application is a continuation of International Patent Application No. PCT/CN2022/102507, filed on Jun. 29, 2022, which is based upon, and claims priority to, Chinese Patent Application No. 202210656240.1, filed on Jun. 10, 2022. The disclosures of these applications are hereby incorporated by reference in their entirety.

TECHNICAL FIELD

The disclosure relates to the technical field of semiconductor, and relates to but is not limited to, a semiconductor structure and a method for forming the same.

BACKGROUND

Dynamic random access memory (DRAM) is a semiconductor memory device commonly used in computers, which is composed of many repetitive memory units. In general, each memory unit includes a capacitor and a transistor, and the source of the transistor is connected with the capacitor through a storage node contact and a landing pad, so as to read the data information stored in the capacitor or write the data information into the capacitor for storage.

At present, DRAM is mostly manufactured by using a $6F^2$ arrangement or a buried word line process. However, it is very difficult to miniaturize DRAM in this process. Although the performance of DRAM can be improved by using new materials, this undoubtedly increases the process complexity and manufacturing cost of DRAM. On the basis of this, in the related art, vertical transistors are used to manufacture DRAM with $4F^2$ arrangement. However, a large number of charges (or holes) will be accumulated in the channels of vertical transistors, but have no a path to be discharged, so the accumulation of more and more charges (or holes) will lead to the failure of vertical transistors to work normally. Therefore, there is a certain degree of floating body effect (FBE) in the DRAM structure formed by using vertical transistors in related art, which affects the performance of DRAM.

SUMMARY

In view of this, the embodiments of the disclosure provide a semiconductor structure and a method for forming the same.

In a first aspect, embodiments of the disclosure provide a method for forming a semiconductor structure. The method includes the following operations.

A semiconductor substrate is provided, and includes a plurality of active pillars arranged at intervals.

The active pillar is etched to form an annular groove. The annular groove does not expose a top surface and a bottom surface of the active pillar.

A first semiconductor layer is formed in the annular groove to form the semiconductor structure. A band gap of the first semiconductor layer is smaller than a band gap of the active pillar.

In a second aspect, embodiments of the disclosure provide a semiconductor structure formed by the above method for forming a semiconductor structure. The semiconductor structure includes a semiconductor substrate and a first semiconductor layer.

The semiconductor substrate is formed with a plurality of active pillars arranged at intervals. Each of the active pillars includes an annular groove, and the annular groove does not expose a top surface and a bottom surface of the active pillar.

The first semiconductor layer is located in the annular groove. A band gap of the first semiconductor layer is smaller than a band gap of the active pillar.

BRIEF DESCRIPTION OF THE DRAWINGS

In the accompanying drawings (which may not be drawn to scale), the similar reference numerals may depict similar components in different views. The similar reference numerals with different letter suffixes may denote different examples of similar components. The drawings generally illustrate, by way of examples, and not limitation, various embodiments discussed herein.

DETAILED DESCRIPTION

Figure 1:
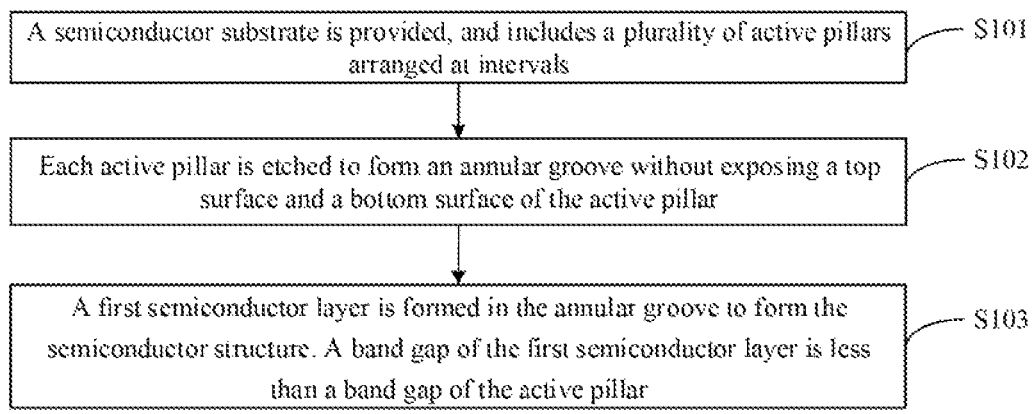
FIG. 1 shows a flowchart of a method for forming a semiconductor structure provided by the embodiment of the disclosure.

Exemplary embodiments of the present disclosure will be described in more detail below with reference to the accompanying drawings. Although exemplary embodiments of the present disclosure are shown in the drawings, it should be understood that the present disclosure may be implemented in various forms and should not be limited to the specific embodiments set forth herein. Instead, these embodiments are provided to enable a more thorough understanding of the disclosure and to fully convey the scope of the disclosure to those skilled in the art.

In the description below, numerous details are given to provide a more thorough understanding of the disclosure. However, it will be apparent to those skilled in the art that the disclosure may be implemented without one or more of these details. In other examples, some technical features well-known in the art are not described in order to avoid confusion with the present disclosure. That is, not all of the features of actual embodiments are described herein, and well-known functions and structures are not described in detail.

In the drawings, the dimension and relative dimension of a layer, an area, or an element may be exaggerated for clarity. The same reference numeral denotes the same element throughout the text.

It should be understood that when an element or a layer is described to as "on", "adjacent to", "connected to" or "coupled to" another element or layer, it may be directly on the other element or layer, adjacent to the other element or layer, or connected to or coupled to the other element or layer, or there may be an intermediate element or layer therebetween. Instead, when an element is described as "directly on", "directly adjacent to", "directly connected to"

or "directly coupled to" another element or layer, there is no intermediate element or layer therebetween. It should be understood that although the terms, "first", "second", "third" and the like may be used to describe various elements, components, regions, layers, and/or portions, these elements, components, regions, layers, and/or portions should not be limited by these terms. These terms are only used to distinguish one element, component, region, layer or portion from another element, component, region, layer or portion. Therefore, without departing from the teaching of the present disclosure, a first element, component, region, layer or portion discussed hereinafter may be expressed as a second element, component, region, layer or portion. While discussing a second element, component, region, layer or portion, it does not imply that a first element, component, region, layer or portion is necessarily present in the present disclosure.

The terms used herein are intended to describe specific embodiments only and are not to be limitations of the present disclosure. As used herein, the singular forms "a/an", "one", and "the/said" are intended to include the plural forms as well, unless the context clearly dictates otherwise. It should be further understood that when terms "consist of" and/or "comprise/include" used in the specification mean that the stated features, integers, steps, operations, elements and/or components are present, but the presence or addition of one or more of other features, integers, steps, operations, elements, components and/or combinations is not excluded. When used herein, the term "and/or" includes any of the listed items and all combinations thereof.

Embodiments of the disclosure provide a method for forming a semiconductor structure. FIG. 1 shows a flowchart of a method for forming a semiconductor structure provided by the embodiment of the disclosure. As shown in FIG. 1, the method for forming a semiconductor structure includes the following operations. At step S101, a semiconductor substrate is provided, which includes a plurality of active pillars arranged at intervals.

The semiconductor substrate may include a top surface on the front and a bottom surface on the back opposite to the front, a first direction and a second direction intersecting each other (e.g. perpendicular to each other) may be defined on the plane where the semiconductor substrate is located, and a direction perpendicular to the top surface and bottom surface of the semiconductor substrate is defined as a third direction, regardless of ignoring the fatness of the top and bottom surfaces. In the embodiments of the present disclosure, the first direction is defined as an X-axis direction, the second direction is defined as a Y-axis direction, and the third direction is defined as a Z-axis direction.

In embodiments of the disclosure, the semiconductor substrate may be a silicon substrate. The semiconductor substrate may also include other semiconductor elements, such as germanium (Ge), or may include semiconductor compounds, such as silicon carbide (SiC), gallium arsenide (GaAs), gallium phosphide (GaP), indium phosphide (InP), indium arsenide (InAs) or indium antimonide (InSb), or may include other semiconductor alloys such as silicon germanium (SiGe), arsenic gallium phosphide (GaAsP), indium aluminum arsenide (AlInAs), gallium aluminum arsenide (AlGaAs), indium gallium arsenide (GaInAs), indium gallium phosphide (GaInP), and/or indium gallium arsenophosphate (GaInAsP) or combinations thereof.

In embodiments of the disclosure, the semiconductor substrate includes a plurality of active pillars arranged in an array along the first direction and the second direction, and the active pillars are used for forming transistors of the semiconductor structure.

In embodiments of the disclosure, the active pillar may be in a shape of right prism (e.g. quadrangular prism, hexagonal prism, octagonal prism) or a cylinder.

In embodiments of the disclosure, the semiconductor substrate and the active pillars may be formed in one step by etching, and both the semiconductor substrate and the active pillars may be P-type doped. For example, in the embodiments of the disclosure, the active pillars may be P-type doped silicon pillars, and the band gap of the active pillars is in a range of 1.0 to 1.3 electron volt (eV).

At step S102, the active pillar is etched to form an annular groove, and the annular groove does not expose a top surface and a bottom surface of the active pillar.

In embodiments of the disclosure, part of the active pillar may be etched transversely along the second direction by wet etching to form an annular groove in a middle part of the active pillar, so that the annular groove does not expose the top surface and the bottom surface of the active pillar.

In embodiments of the disclosure, part of the active pillar that is not etched remains in the middle of the annular groove, and the remaining part of the active pillar (i.e., the active pillar located in the projection area of the annular groove along the second direction) is subsequently used to form the source of the transistor of the semiconductor structure.

In step S103, a first semiconductor layer is formed in the annular groove to form the semiconductor structure. The band gap of the first semiconductor layer is smaller than the band gap of the active pillar.

In the embodiments of the disclosure, the first semiconductor layer may be used as the source of the transistor, and the first semiconductor layer may be an N-type doped semiconductor layer, for example, an N-type doped silicon germanium layer. The band gap of the first semiconductor layer is in a range of 0.7 eV to 0.97 eV.

In other embodiments, the material of the first semiconductor layer may also be a metal sulfide material, such as iron sulfide, manganese sulfide, titanium sulfide, or nickel sulfide.

In the embodiments of the disclosure, since the band gap of the first semiconductor layer is smaller than the band gap of the active pillar, the potential barrier between the source and the semiconductor substrate is reduced, so that the holes accumulated in the channel can be easily discharged, and the parasitic bipolar transistor effect is weakened, thereby effectively suppressing the floating body effect of the formed semiconductor structure and improving the electrical performances and manufacture yield of the semiconductor structure.

Figure 2A:
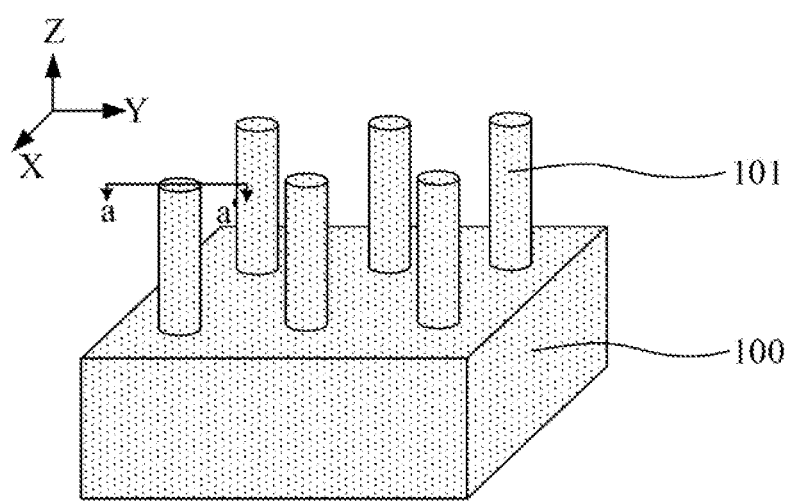
FIGS. 2A to 2R schematically show structures in a process of forming the semiconductor structures provided by the embodiment of the disclosure.
Figure 2B:
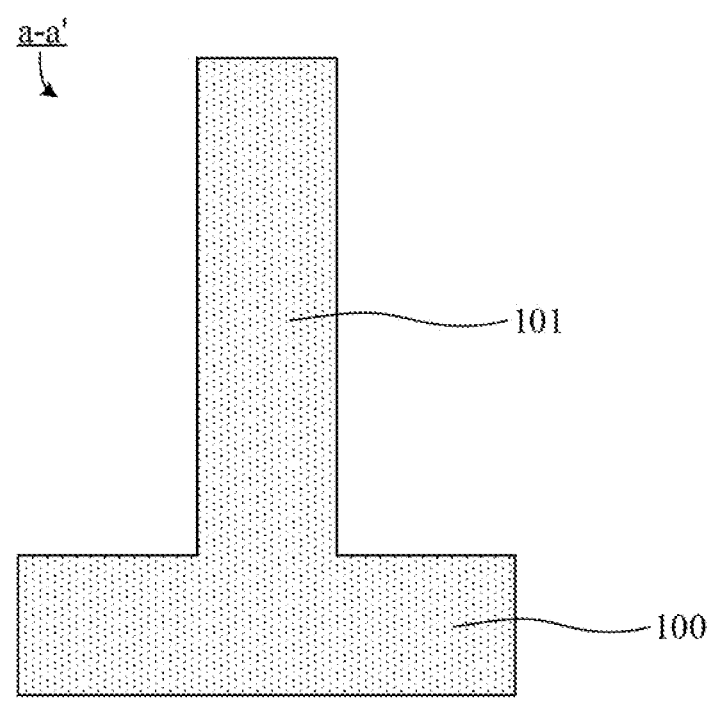
Figure 2C:
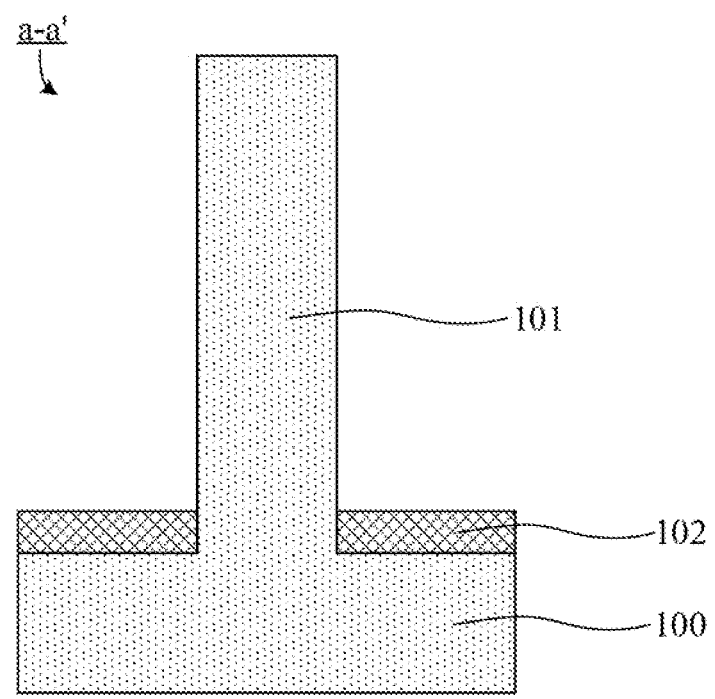
Figure 2D:
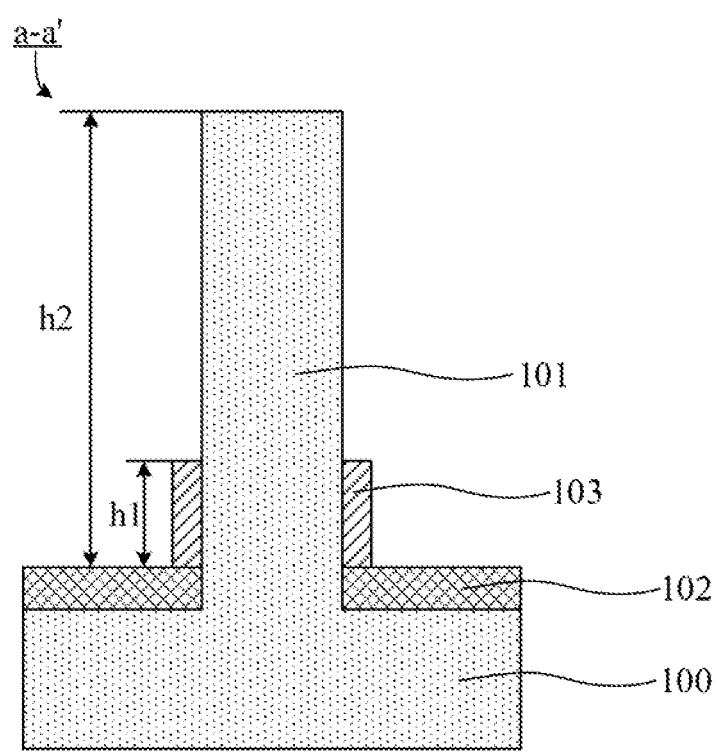
Figure 2E:
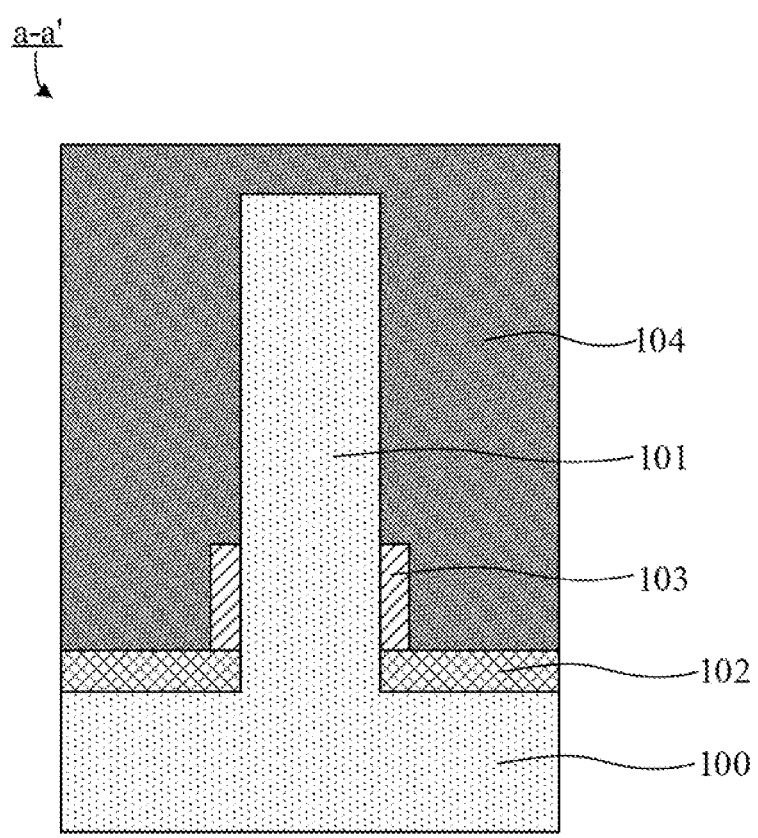
Figure 2F:
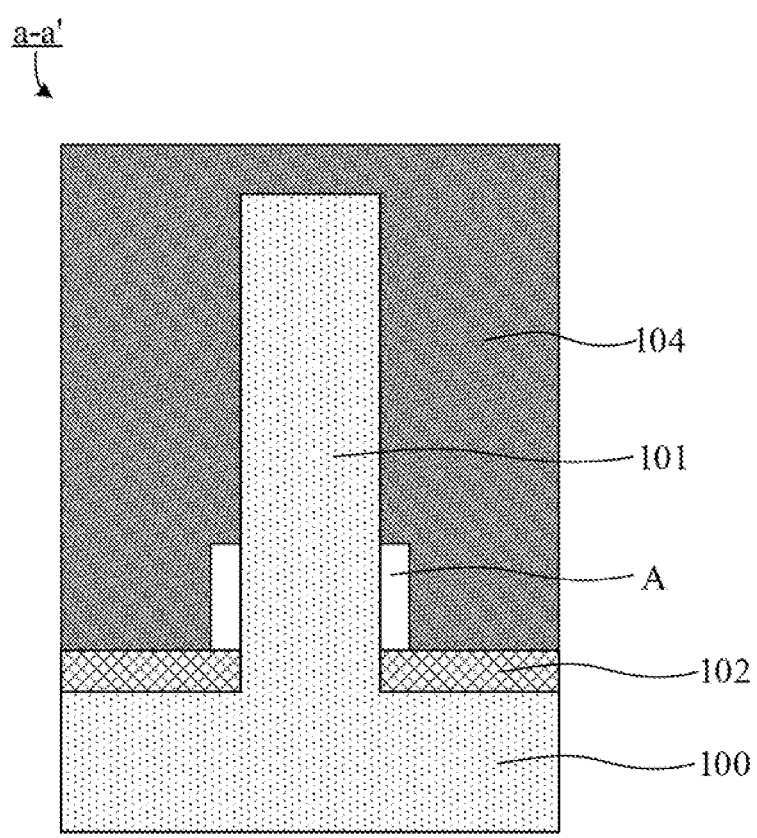
Figure 2G:
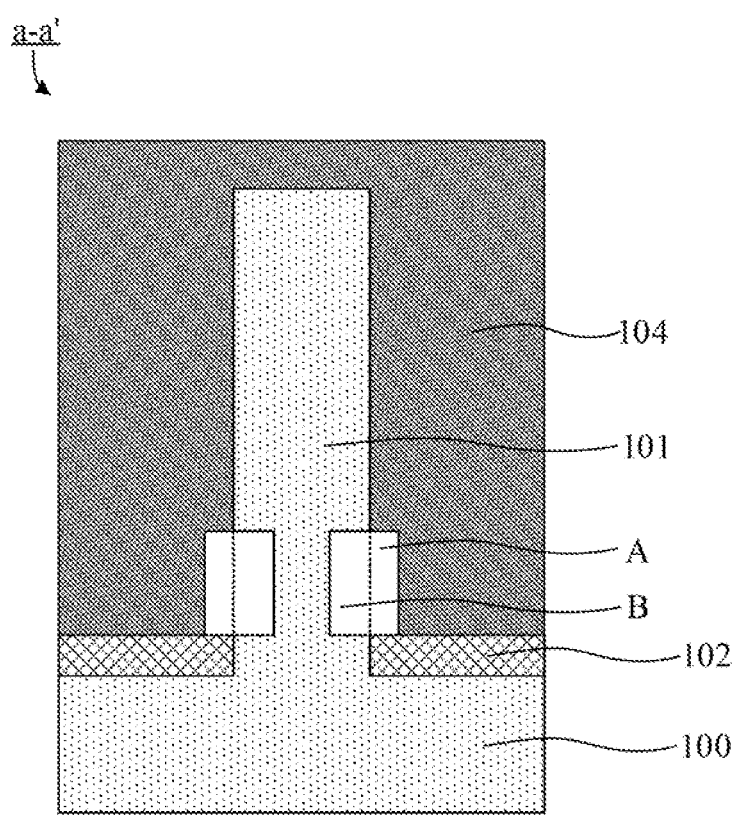
Figure 2H:
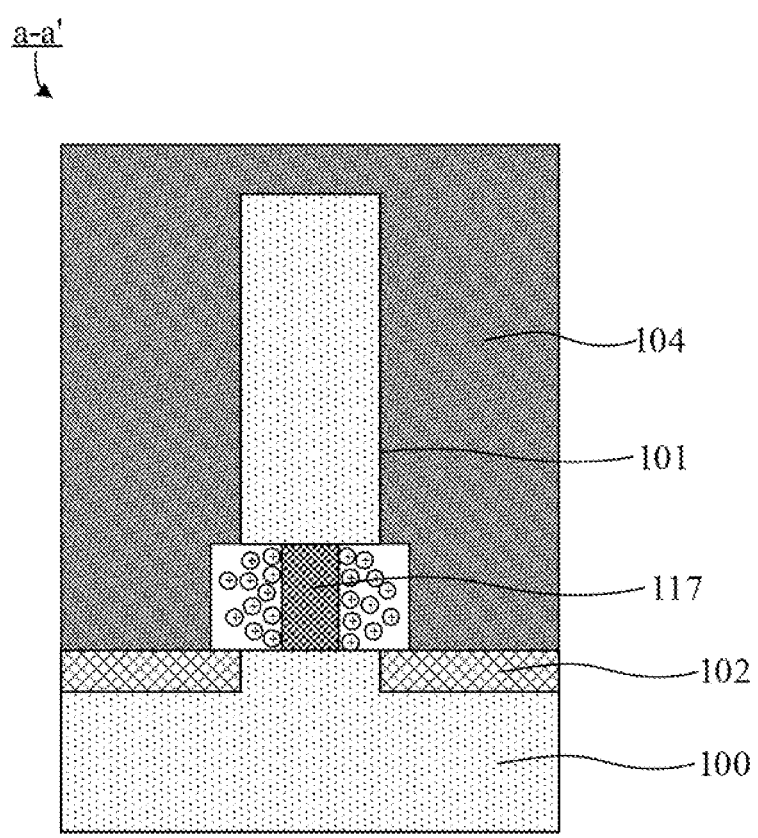
Figure 2I:
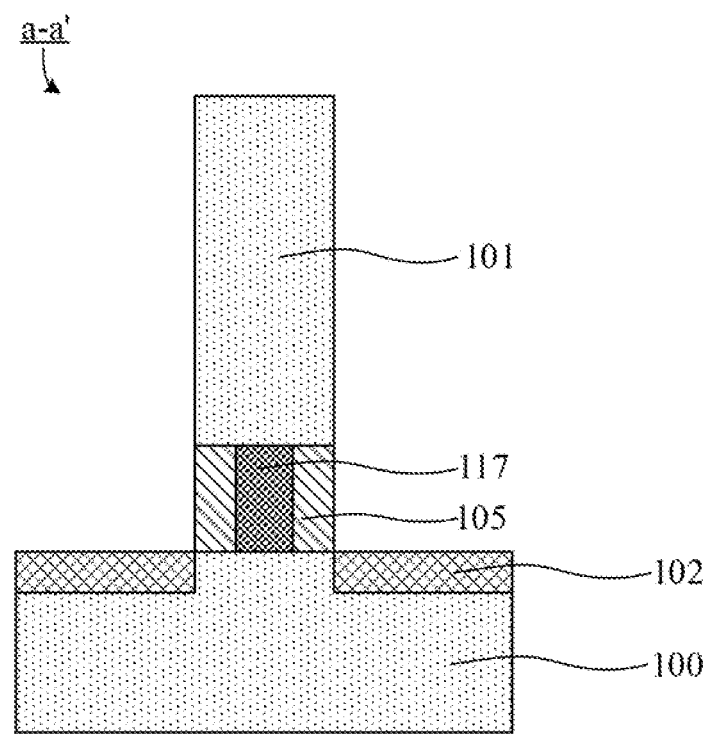
Figure 2J:
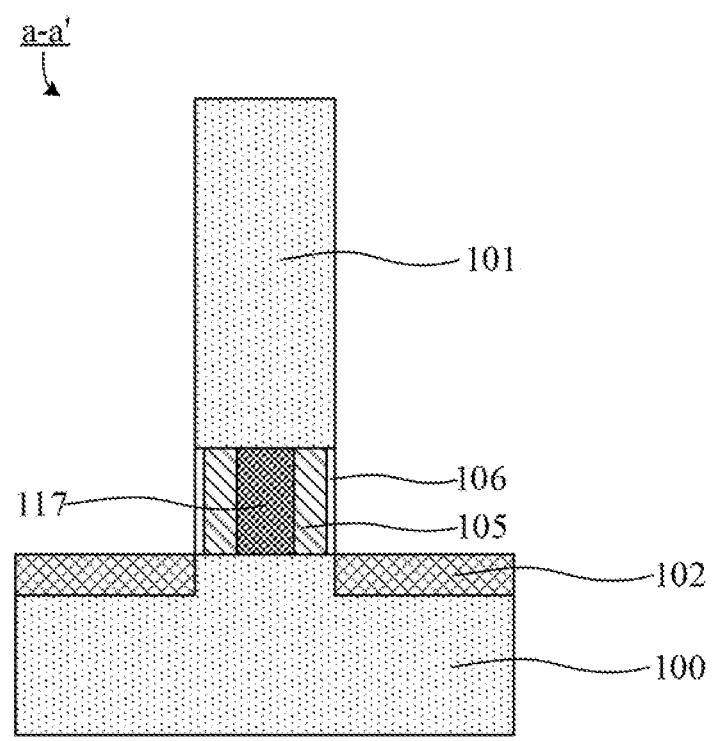
Figure 2K:
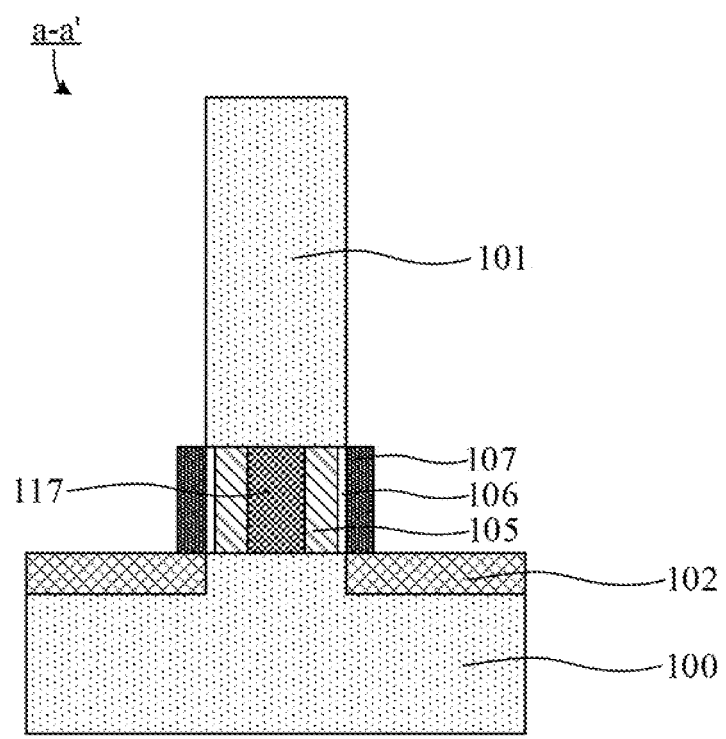
Figure 2L:
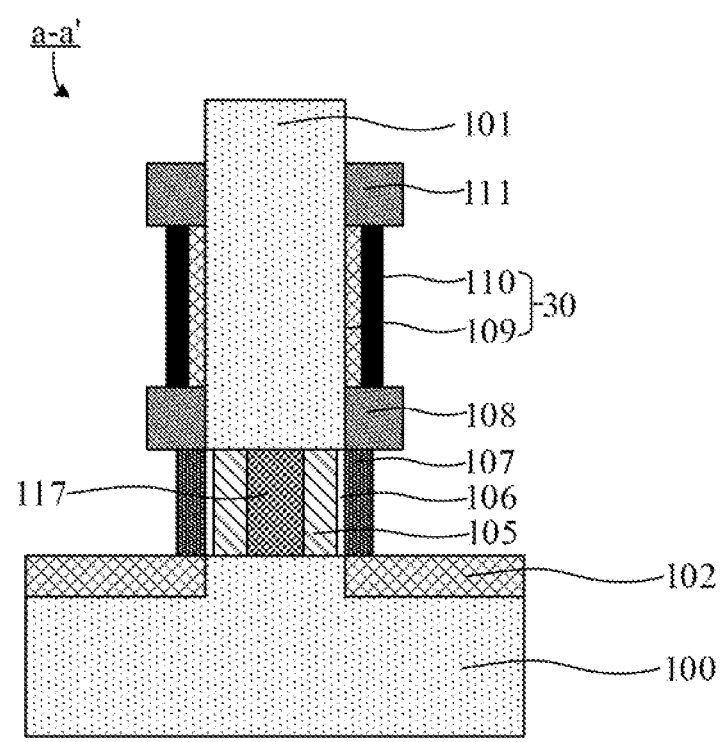
Figure 2M:
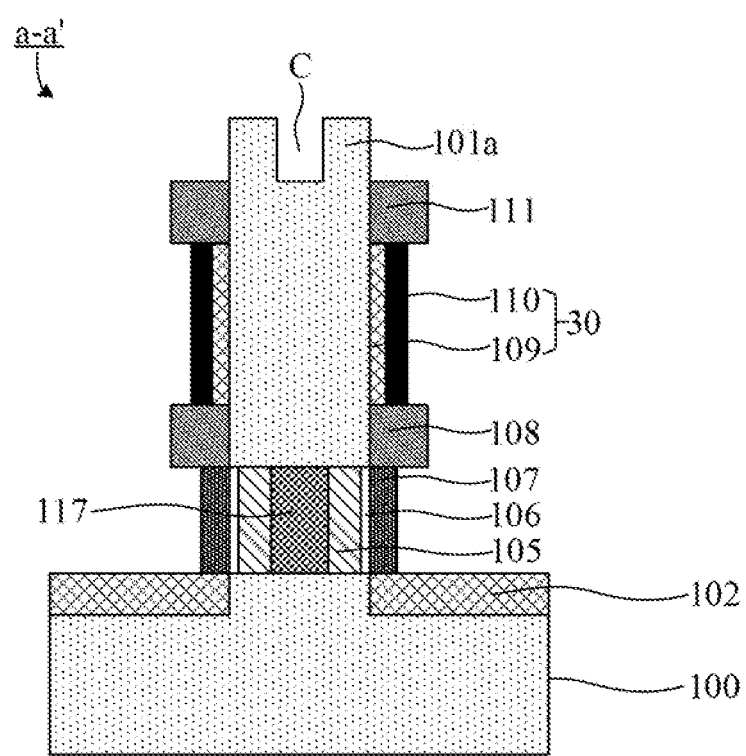
Figure 2N:
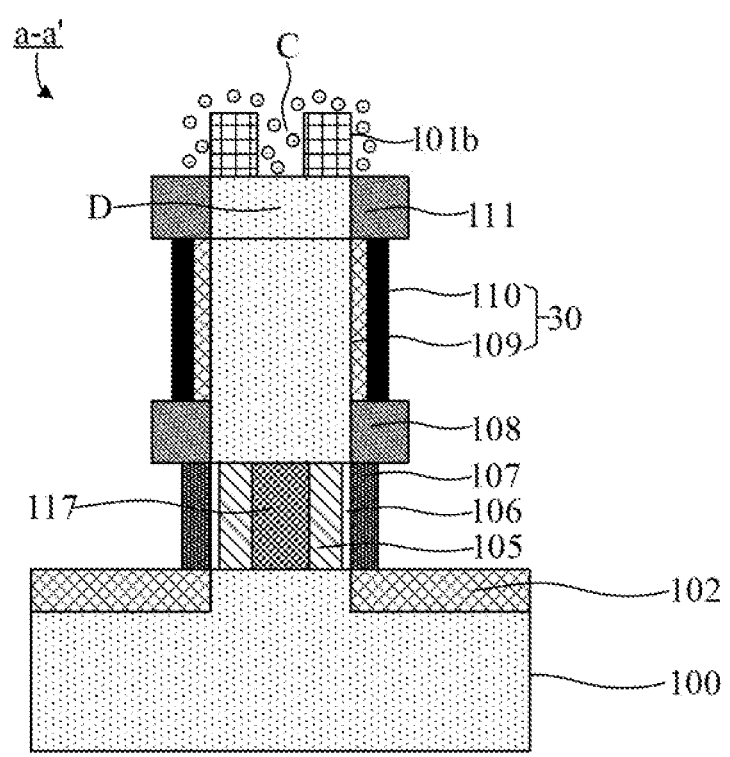
Figure 2O:
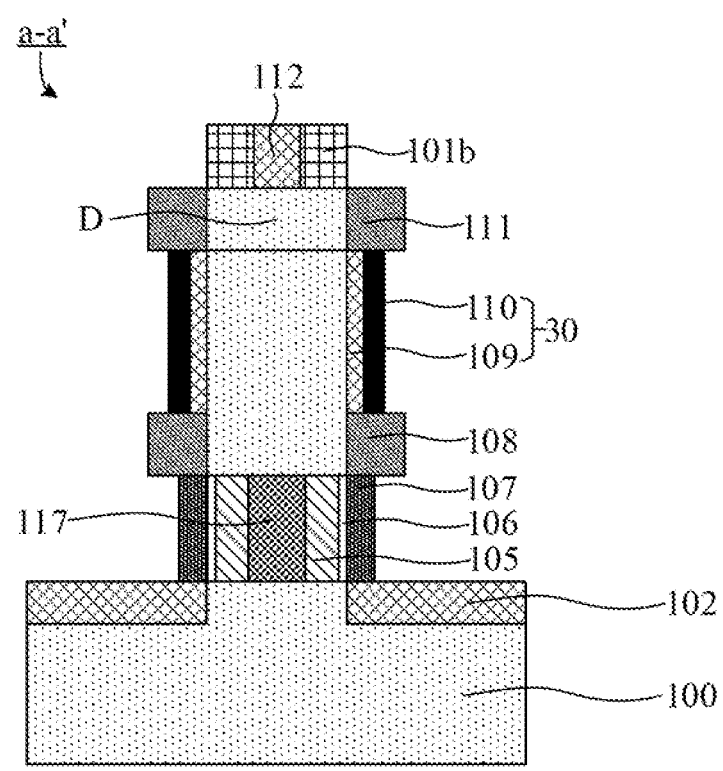
Figure 2P:
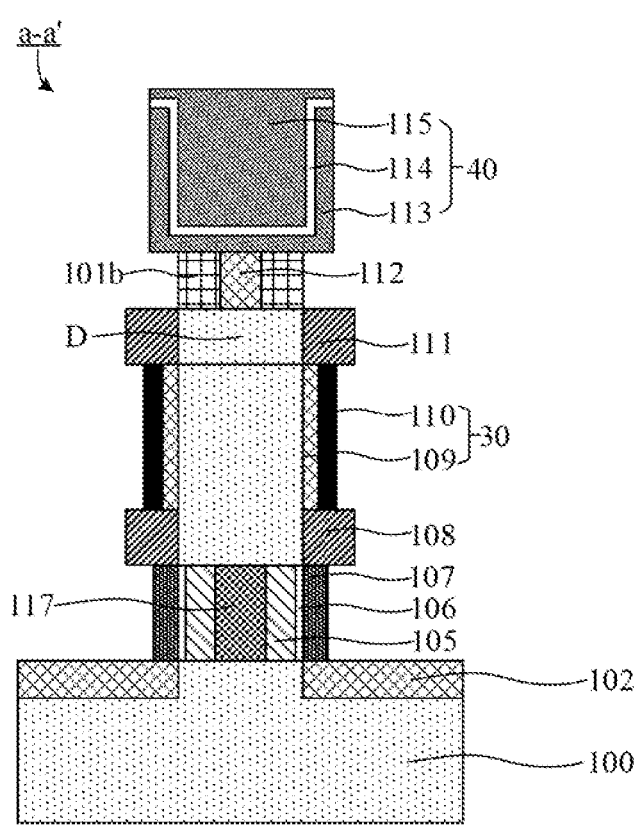
Figure 2Q:
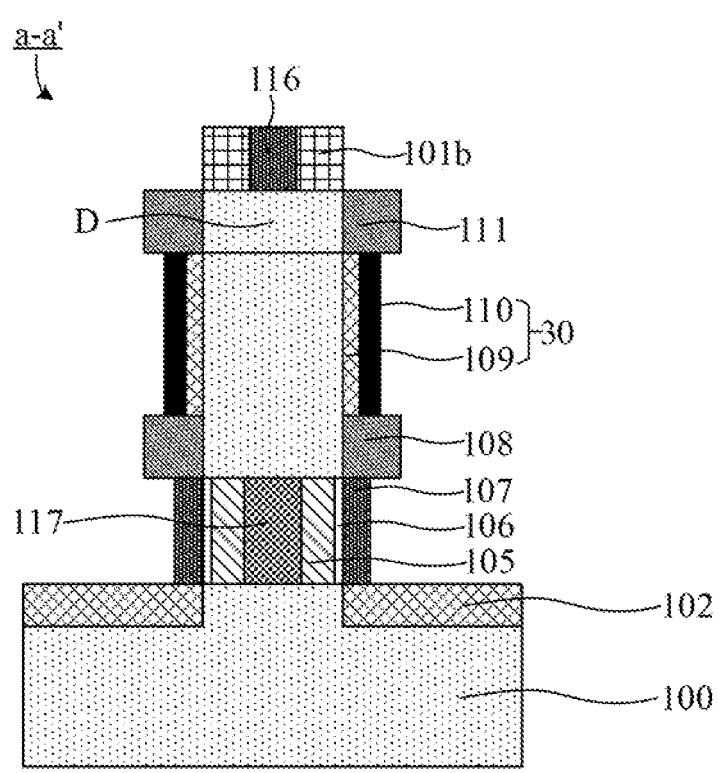
Figure 2R:
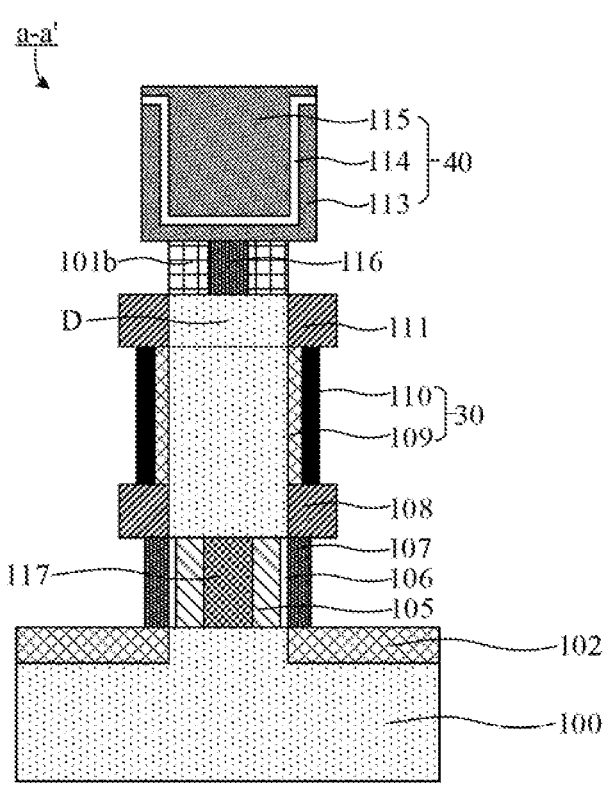

FIGS. 2A to 2R schematically show structures in a process of forming the semiconductor structures provided by the embodiment of the disclosure. The forming process of a semiconductor structure provided by the embodiments of the disclosure will be described in detail below in combination with FIGS. 2A to 2R Firstly, referring to FIGS. 2A to 2B, step S101 is performed. A semiconductor substrate 100 is provided, and includes a plurality of active pillars 101 arranged at intervals.

In the embodiment of the disclosure, as shown in FIG. 2A, the semiconductor substrate 100 includes the plurality of active pillars 101 arranged in an array along the X-axis direction (the first direction) and the Y-axis direction (the second direction).

For facilitating to understand, FIG. 2B shows a cross-sectional view of only one active pillar 101 along a-a' in FIG. 2A, and FIGS. 2C to 2R show related ross-sectional views along a-a' in subsequent forming processes.

Subsequently, referring to FIG. 2C to 2G, step S102 is performed. The active pillar is etched to form an annular groove B. The annular groove B does not expose the top surface and the bottom surface of the active pillar 101.

In some embodiments, the annular groove B may be formed by the following operations. An isolation layer 102 is formed on the surface of the semiconductor substrate 100. A first sacrificial layer 103 covering part of the active pillar 101 is formed on the surface of the isolation layer 102. A second sacrificial layer 104 is formed on the surface of the isolation layer 102, the surface of the first sacrificial layer 103, and the surface of the active pillar 101. The first sacrificial layer 103 is removed to form a first groove A. Part of the active pillar 101 is etched through the first groove A to form an annular groove B.

As shown in FIG. 2C, the isolation layer 102 is formed on the surface of the semiconductor substrate 100. In the embodiment of the disclosure, the isolation layer 102 is used for isolating the semiconductor substrate 100 and the active pillar 101, so as to prevent the leakage of the semiconductor substrate 100. The material of the isolation layer 102 may be oxide or silicon oxynitride, such as silicon oxide.

As shown in FIG. 2D, the first sacrificial layer 103 covering part of the active pillar 101 is formed on the surface of the isolation layer 102. In the embodiment of the disclosure, the height h1 of the first sacrificial layer 103 is smaller than the height h2 of the active pillar 101, and the first sacrificial layer 103 is used to define the position of the bit line structure in the subsequent processes. Therefore, the first sacrificial layer 103 has a high wet etching selectivity ratio with respect to the semiconductor substrate 100 (or the active pillar 101) and the isolation layer 102. The material of the first sacrificial layer 103 may be one or any combination of silicon nitride (SiN), silicon oxynitride (SiON), amorphous carbon (a-C), or silicon oxycarbonitride (SiOCN).

As shown in FIG. 2E, the second sacrificial layer 104 is formed on the surfaces of the isolation layer 102, the first sacrificial layer 103, and the active pillar 101. In the embodiment of the disclosure, the second sacrificial layer 104 is used to protect the active pillar 101 when forming the bit line structure. Therefore, the second sacrificial layer 104 has a high wet etching selectivity ratio with respect to the semiconductor substrate 100 (or the active pillar 101) and the isolation layer 102. The material of the second sacrificial layer 104 may be one or any combination of silicon nitride, silicon oxynitride, amorphous carbon or silicon oxycarbonitride.

It should be noted that, the etching selectivity ratio between the first sacrificial layer 103 and the active pillar 101 is larger than the etching selectivity ratio between the second sacrificial layer 104 and the active pillar 101. That is, the first sacrificial layer 103 is easier to be removed by etching than the second sacrificial layer 104 under the same etching conditions.

As shown in FIG. 2F, the first sacrificial layer 103 is removed to form the first groove A. In the embodiment of the disclosure, the first sacrificial layer 103 may be removed by wet etching technique. For example, the first sacrificial layer 103 may be etched by strong acids, such as concentrated sulfuric acid, hydrofluoric acid, concentrated nitric acid, or the like to form the first groove A.

As shown in FIG. 2Q part of the active pillar 101 is etched through the first groove A to form the annular groove B. In the embodiment of the disclosure, part of the active pillar 101 can be removed by transverse dry etching to form the annular groove B. The annular groove B is located in the middle and lower part of the active pillar 101 and does not expose the bottom surface and the top surface of the active pillar 101.

In embodiments of the disclosure, the isolation layer 102, the first sacrificial layer 103, and the second sacrificial layer 104 may all be formed by any suitable deposition process, such as chemical vapor deposition (PVD), physical vapor deposition (PVD), atomic layer deposition (ALD), spin coating, coating, or a furnace tube process.

In some embodiments, referring to FIG. 2H, after the annular groove B is formed, the method for forming the semiconductor structure further includes an operation of performing a first heavy doping on an unetched part of the active pillar 101 located in the middle of the annular groove B to form a first heavy doped region 117. In embodiments of the disclosure, the first heavy doping may be P-type doping on the active pillar 101. For example, the active pillar 101 is doped with trivalent impurity elements, such as boron, gallium, indium, or the like.

In the embodiment of the disclosure, the first heavy doped region 117 is formed to form a conductive channel that allows holes accumulated in the channel of the transistor to enter the semiconductor substrate 1M through a manner of band to band tunneling, thereby avoiding the conduction of the parasitic triode and improving the electrical performances of the semiconductor structure.

Subsequently, referring to FIG. 2I, step S103 is performed. A first semiconductor layer 105 is formed in the annular groove B to form the semiconductor structure. The band gap of the first semiconductor layer 105 is smaller than the band gap of the active pillar 101.

In the embodiment of the disclosure, the first semiconductor layer 105 is the source of the semiconductor structure.

In some embodiments, the formation of the first semiconductor layer 105 may include the following operations. A semiconductor material is filled in the annular groove B to form the first semiconductor layer 105. The first semiconductor layer 105 fully fills the annular groove B. In some embodiments, the semiconductor material of the first semiconductor layer 105 may be silicon germanium.

In the embodiments of the disclosure, since the band gap of the first semiconductor layer 105 is smaller than the band gap of the active pillar 101, the hole current of the transistor of the final formed semiconductor structure is increased, and the potential barrier between the source and the semiconductor substrate 100 is reduced. Therefore, the holes accumulated in the channel of the transistor can be easily discharged, the parasitic bipolar transistor effect is weakened, and the broken down voltage is increased, which can effectively suppress the floating body effect of the formed semiconductor structure.

In some embodiments, with continued reference to FIG. 2I, after the first semiconductor layer 105 is formed, the method for forming the semiconductor structure further includes an operation of removing the second sacrificial layer 104.

In the embodiments of the disclosure, the second sacrificial layer 104 may be removed by wet etching or dry etching technique (e.g. plasma etching technique, ion milling technique or reactive ion etching technique).

In some embodiments, referring to FIGS. 2J and 2K, the semiconductor structure includes at least a bit line structure. Step S103 may include the following operations. A surface treatment is performed on the first semiconductor layer 105 to form a second semiconductor layer 106. A bit line metal layer 107 is formed on the surface of the second semiconductor layer 106 to form the bit line structure.

In the embodiments of the disclosure, the material of the bit line metal layer 107 includes tungsten (W), cobalt (Co), copper (Cu), aluminum (Al), titanium nitride (TiN), a titanium-containing metal layer, polysilicon, or any combination thereof.

In some embodiments, a surface treatment is performed on the first semiconductor layer 105, and the second semiconductor layer 106 may be formed by the following operations. A metal material is deposited on the surface of the first semiconductor layer 105 to form a metal layer (not shown), and then an annealing treatment is performed on the metal layer and the first semiconductor layer 105 to form the second semiconductor layer 106.

In the embodiments of the disclosure, the metal material forming the second semiconductor layer 106 may be any one of titanium (Ti), tantalum (Ta), nickel (Ni), tungsten, platinum (Pt), and palladium (Pd). Metal silicide formed by reacting the metal material deposited on the surface of the first semiconductor layer 105 with the first semiconductor layer 105 through a rapid thermal annealing treatment, can be used as the second semiconductor layer 106.

In the embodiments of the disclosure, the bit line structure (i.e. the bit line metal layer 107) is connected with the first semiconductor layer 105 through the second semiconductor layer 106 (i.e. metal silicide). Since the metal silicide has a lower resistance, the contact resistance between the bit line metal layer 107 and the first semiconductor layer 105 can be reduced, thereby reducing the power consumption of the formed semiconductor structure.

In some embodiments, after the bit line structures are formed, the method for forming the semiconductor structure further includes an operation of forming a gate-all-around structure, a storage node contact and a capacitor structure.

Referring to FIG. 2L, the gate-all-around structure 30 may be formed by the following operations. A first insulating layer 108 covering part of the active pillar 101 is formed in a gap between the bit line structures and the surface of the bit line metal layer 107. A gate oxide layer 109 and a gate metal layer 110 covering part of the active pillar are sequentially formed on the surfaces of the first insulating layer 108 and the active pillar 101 to form the gate-all-around structure 30. The top surface of the gate oxide layer 109 is located lower than the top surface of the active pillar 101.

In the embodiments of the disclosure, on the one hand, the first insulating layer 108 is used to isolate adjacent bit line structures and prevent the leakage of the bit line structures, which makes it impossible to perform read or write operations on specific transistors; on the other hand, the first insulating layer 108 may also be used to achieve an isolation between the bit line structure and the gate-all-around structure formed subsequently.

In the embodiments of the disclosure, the first insulating layer 108, the gate oxide layer 109 and the gate metal layer 110 may be formed by any suitable deposition process. The material of the first insulating layer 108 may be silicon nitride; the material of the gate oxide layer 109 may be oxide, such as silicon oxide; and the material of the gate metal layer 110 may be any material having good electrical conductivity, such as titanium nitride.

In the embodiments of the disclosure, the gate-all-around structure 30 has a wide channel region, so that the short channel effect can be reduced, and the control ability of the gate can be improved, thereby further improving the performance of the formed semiconductor structure.

In some embodiments, with continued reference to FIG. 2L, after the gate-all-around structure 30 is formed, the method for forming a semiconductor structure further includes an operation of forming a second insulating layer 111 covering part of the active pillar 101 on a gap between the gate-all-around structures 30, the surface of the gate oxide layer 109, and the surface of the gate metal layer 110.

In the embodiments of the disclosure, on the one hand, the second insulating layer 111 is used to isolate adjacent gate-all-around structures 30 and prevent the conduction of the gate-all-around structures 30, which makes it impossible to control single transistor; on the other hand, the second insulating layer 111 may also isolate the gate-all-around structure 30 and the capacitor structure formed subsequently. The material of the second insulating layer 111 may be silicon nitride, silicon oxide or silicon oxynitride.

Referring to FIGS. 2M and 2N, the storage node contact 101b may be formed by the following operations. The active pillar 101 is etched to form a second groove C and an annular pillar 101a, and the bottom surface of the second groove C is flush with the top surface of the second insulating layer 111. A second heavy doping is performed on the annular pillar 101a to form a storage node contact 101b.

In the embodiments of the disclosure, the active pillar 101 may be etched by a dry etching process (e.g. a plasma etching process, reactive ion etching process, or ion milling process) to form the annular pillar 101a and the second groove C. The second heavy doping may be N-type doping on the annular pillar 101a. For example, the active pillar 101 is doped with pentavalent impurity elements, such as phosphorus, antimony, arsenic, or the like, so as to improve the conductivity of the annular pillar 101a.

In embodiments of the disclosure, the doping type of the first heavy doping is opposite to the doping type of the second heavy doping.

In the embodiments of the disclosure, performing the second heavy doping on the annular pillar 101a is intended to reduce the internal resistance of the annular pillar 101a, to improve the conductivity of the memory node contact 101b, thereby further reducing the contact resistance between the formed memory node contact 101b and the drain and capacitor structure, and thus improving the electrical performance of the semiconductor structure.

With continued reference to FIG. 2N, the active pillar 101 located in the projection area of the second insulating layer 111 constitute the drain D of the semiconductor structure.

In embodiments of the disclosure, the memory node contact is made into a hollow structure. That is, the second groove C is formed in the active pillar 101 in order to increase the doping region of the second heavy doping, i.e., to realize more sufficient heavy doping of the annular pillar 101a, thereby reducing the contact resistance between the memory node contact 101b and the drain D and the capacitor structure.

In some embodiments, referring to FIG. 2O, the method for forming the semiconductor structure further includes an operation of filling an insulating material in the second groove to form a third insulating layer 112.

In the embodiments of the disclosure, the third insulating layer 112 fully fills the second groove. The top surface of the third insulating layer 112 is flush with the top surface of the storage node contact 101b. The insulating material may be oxide or nitride, such as silicon oxide, silicon nitride or silicon oxynitride.

In the embodiments of the disclosure, the third insulating layer 112 is located inside the storage node contact 101b, and a capacitor structure is subsequently formed on the surfaces of the third insulating layer 112 and the storage node contact 101b. The third insulating layer 12 can prevent the leakage of the capacitor structure.

In some embodiments, referring to FIG. 2P, the capacitor structure 40 may be formed by the following operations. A first electrode layer 113, a dielectric layer 114, and a second electrode layer 115 are sequentially formed on the surfaces of the memory node contact 101b and the third insulating layer 112 to form the capacitor structure 40.

In the embodiments of the disclosure, the first electrode layer 113, the dielectric layer 114, and the second electrode layer 115 may be formed by sequentially depositing the first electrode material, the dielectric material, and the second electrode material on the surfaces of the memory node contact 101b and the third insulating layer 112. Herein, the first electrode material, the dielectric material, and the second electrode material can be formed by any one of the following deposition processes: chemical vapor deposition process, physical vapor deposition process, and atomic layer deposition process. The first electrode material and the second electrode material may include metal nitride or metal silicide, such as titanium nitride. The dielectric material may include a high-K dielectric material, for example, one or any combination of lanthanum oxide ($La_2O_3$), alumina ($Al_2O_3$), hafnium oxide ($HfO_2$), hafnium oxynitride (HfON), hafnium silicate (HfSiOx) or zirconia ($ZrO_2$). In other embodiments, the first electrode material and the second electrode material may also be polysilicon.

In some embodiments, referring to FIG. 2Q, the method for forming the semiconductor structure further includes an operation of filling a conductive material in the second groove to form a conductive layer 116.

In the embodiments of the disclosure, the conductive layer 116 fully fills the second groove. The top surface of the conductive layer 116 is flush with the top surface of the storage node contact 101b. The conductive material may be any one of titanium, tantalum, nickel, tungsten, platinum, palladium, and polysilicon.

Referring to FIG. 2R, the capacitor structure 40 may also be formed by the following operations. A first electrode layer 113, a dielectric layer 114, and a second electrode layer 115 are sequentially formed on the surfaces of the memory node contact 101b and the conductive layer 116 to form the capacitor structure 40.

In the embodiments of the disclosure, the first electrode layer 113, the dielectric layer 114, and the second electrode layer 115 may be formed by sequentially depositing the first electrode material, the dielectric material, and the second electrode material on the surfaces of the memory node contact 101b and the conductive layer 116. The first electrode material and the second electrode material may include metal nitride or metal silicide, such as titanium nitride. The dielectric material may include a high-K dielectric material, for example one or any combination of lanthanum oxide, alumina, hafnium oxide, hafnium oxynitride, hafnium silicate or zirconia. Herein, the first electrode material, the dielectric material, and the second electrode material can be formed by any one of the following deposition processes: chemical vapor deposition process, physical vapor deposition process, and atomic layer deposition process. The first electrode material and the second electrode material may include metal nitride or metal silicide, such as titanium nitride. The dielectric material may include a high-K dielectric material, for example one or any combination of lanthanum oxide, alumina, hafnium oxide, hafnium oxynitride, hafnium silicate or zirconia. In other embodiments, the first electrode material and the second electrode material may also be polysilicon.

In embodiments of the disclosure, the conductive layer 116 is located in the memory node contact 101b, and the memory node contact 101b and the conductive layer 116 are used for electrically connecting the drain and the capacitor structure of the semiconductor structure. Therefore, the conductive layer 116 can improve the conductivity of the memory node contact 101b, thereby further reducing the contact resistance between the memory node contact 101b and the capacitor structure, and improving the electrical performance of the semiconductor structure.

It should be noted that, in the embodiments of the disclosure, a transistor structure is formed on the surface of each active pillar. The drawings of the specification only show the process of forming one transistor.

Since the transistor of the semiconductor structure formed by the embodiments of the disclosure is of a vertical structure, the integration of the semiconductor structure can be improved to realize the miniature of the dimension of the semiconductor structure.

In the embodiments of the disclosure, the active pillar of the source is thinned and is performed with P-type heavy doping (i.e., the first heavy doping), to form a conductive channel. At the same time, N-type SiGe (i.e., the first semiconductor layer) is used instead of the active pillar as the source. Since N-type SiGe has narrow band gap, the hole current is increased. Therefore, the potential barrier between the source and the semiconductor substrate is reduced, so that the holes accumulated in the channel of the transistor can be easily discharged, and the parasitic bipolar transistor effect is weakened, and the broken down voltage is increased, which can effectively suppress the floating body effect of the formed semiconductor structure. In addition, P-type heavy doping can allow the holes accumulated in the channel of the transistor to enter the semiconductor substrate through a manner of band to band tunneling, thus avoiding the conduction of parasitic triode and improving the electrical performances of the formed semiconductor structure.

Figure 3A:
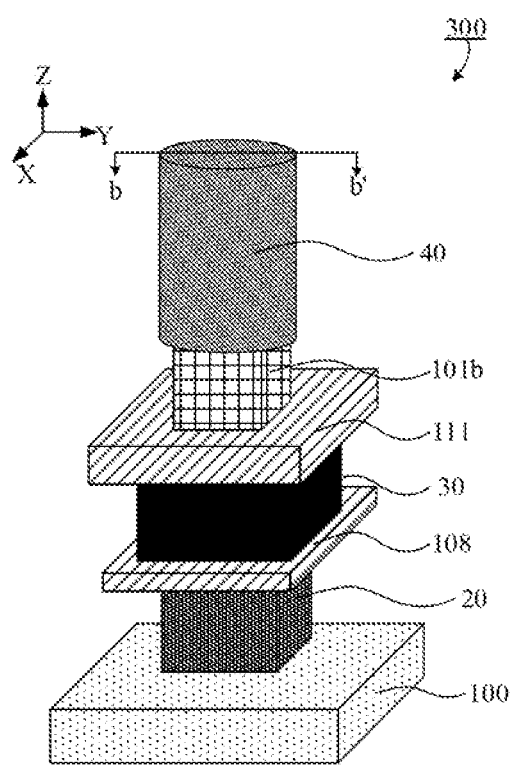
FIG. 3A schematically shows a three-dimensional structure of a semiconductor structure provided by the embodiment of the disclosure.
Figure 3B:
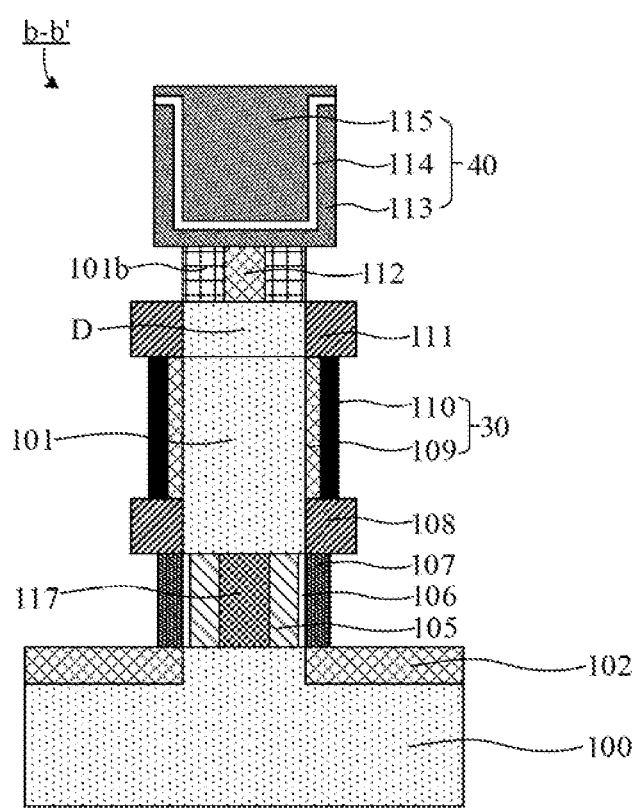
FIGS. 3B and 3C show cross-sectional diagrams of the semiconductor structure in FIG. 3A along b-b' provided by the embodiment of the disclosure.
Figure 3C:
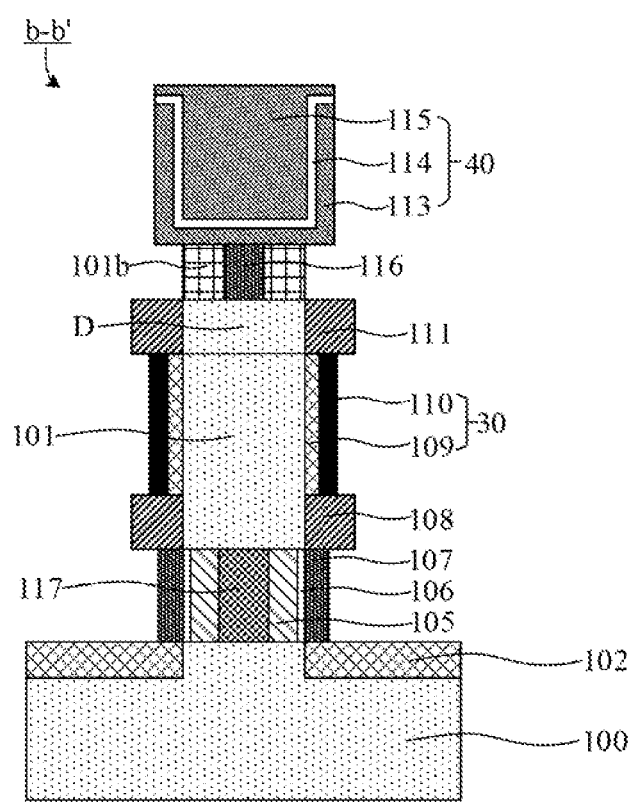

Embodiments of the disclosure provide a semiconductor structure, FIG. 3A schematically shows a three-dimensional structure of a semiconductor structure provided by embodiments of the disclosure. FIGS. 3B and 3C show schematic cross-sectional diagrams of the semiconductor structure in FIG. 3A along b-b' provided by embodiments of the disclosure. As shown in FIGS. 3A to 3C, the semiconductor structure 300 includes a semiconductor substrate 100 and a first semiconductor layer 105.

Herein, the semiconductor substrate 100 includes a plurality of active pillars 101 arranged an array along the X-axis direction (the first direction) and the Y-axis direction (the second direction). Each of the active pillars 101 includes an annular groove that does not expose the top surface and the bottom surface of the active pillar 101.

In the embodiments of the disclosure, the active pillars 101 are used to form transistors of the semiconductor structure 300. The active pillars may be P-type doped silicon pillars, and the band gap of the active pillars is in a range of 1.0 eV to 1.3 eV.

The first semiconductor layer 105 is located in the annular groove. The band gap of the first semiconductor layer 105 is smaller than the band gap of the active pillar 101.

In the embodiments of the disclosure, the first semiconductor layer 105 may be used as the source of the transistor. The first semiconductor layer 105 may be an N-type doped semiconductor layer, for example, an N-type doped silicon germanium layer. The band gap of the first semiconductor layer 105 is in a range of 0.7 eV to 0.97 eV.

In the embodiments of the disclosure, since the band gap of the first semiconductor layer 105 is smaller than the band gap of the active pillar, the potential barrier between the source and the semiconductor substrate can be reduced. Therefore, the holes accumulated in the channel of the transistor can be easily discharged, and the parasitic bipolar transistor effect is weakened, which can effectively suppress the floating body effect of the semiconductor structure and improve the electrical performances of the semiconductor structure 300.

In some embodiments, referring to FIGS. 3A to 3C, the semiconductor structure 300 further includes a second semiconductor layer 106 and a bit line metal layer. Herein, the second semiconductor layer 106 is located on the surface of the first semiconductor layer 105, and the bit line metal layer 107 is located on the surface of the second semiconductor layer 106. In the embodiments of the disclosure, the second semiconductor layer and the bit line metal layer 107 constitute a bit line structure.

In the embodiments of the disclosure, the second semiconductor layer 106 is a metal silicide layer. Since the metal silicide has a lower resistance, the contact resistance between the bit line metal layer 107 and the first semiconductor layer 105 can be reduced, thereby reducing the power consumption of the semiconductor structure 300.

In some embodiments, with continued reference to FIGS. 3A to 3C, the semiconductor structure 300 further includes a gate-all-around structure 30. The gate-all-around structure 30 is located on the surface of part of the active pillar 101, and includes a gate oxide layer 109 and a gate metal layer 110.

In the embodiments of the disclosure, the gate-all-around structure 30 has a wide channel region, so that the short channel effect can be reduced, and the control ability of the gate can be improved, thereby further improving the performance of the semiconductor structure 300).

In some embodiments, with continued reference to FIGS. 3A to 3C, the semiconductor structure 300 further includes a first insulating layer 108 and a second insulating layer 111. The first insulating layer 108 is located on the surface of the bit line structure and in a gap between the bit line structures. The second insulating layer 111 is located on the surface of the gate-all-around structure 30 and in a gap between the gate-all-around structures 30.

In the embodiments of the disclosure, on the one hand, the first insulating layer 108 is used to isolate adjacent bit line structures and prevent the leakage of the bit line structures, which makes it impossible to perform read or write operations on specific transistors; on the other hand, the first insulating layer 108 may also be used to achieve an isolation between the bit line structure and the gate-all-around structure 30. On the one hand, the second insulating layer 111 is used to isolate adjacent gate-all-around structures 30 and prevent the conduction of the gate-all-around structures 30, which makes it impossible to control single transistor; on the other hand, the second insulating layer 11*l* may also isolate the gate-all-around structure 30 and the capacitor structure 30.

In some embodiments, with continued reference to FIGS. 3A-3C, the semiconductor structure 300 further includes a memory node contact 101*b* and a capacitor structure 40. The capacitor structure 40 is located on the surface of the storage node contact 101*b*, and the capacitor structure 40 is electrically connected with the storage node contact 101*b*.

In the embodiment of the disclosure, a second heavy doping is performed on the active pillar 101 to form the storage node contact 101*b*. The second heavy doping may be N-type doping on the annular pillar 101*a*. For example, the active pillar 101 is doped with pentavalent impurity elements, such as phosphorus, antimony, arsenic, or the like. The memory node contact 101*b* formed after the second heavy doping has a lower internal resistance and a higher conductivity, so that the contact resistance between the memory node contact 101*b* and the drain and the capacitor structure is reduced, thereby improving the electrical performances of the semiconductor structure 300.

In some embodiments, with continued reference to FIG. 3B, the semiconductor structure 300 further includes a third insulating layer 112. The third insulating layer 112 is located inside the storage node contact 101*b*. The top surface of the third insulating layer 112 is flush with the top surface of the storage node contact 101*b*, and the bottom surface of the third insulating layer 112 is flush with the bottom surface of the storage node contact 101*b*.

In the embodiments of the disclosure, the third insulating layer 112 can prevent the leakage of the capacitor structure 40.

In some embodiments, with continued reference to FIG. 3C, the semiconductor structure 300 further includes a conductive layer 116. The conductive layer 116 is located inside the storage node contact 101*b*. The top surface of the conductive layer 116 is flush with the top surface of the storage node contact 101*b*, and the bottom surface of the conductive layer 116 is flush with the bottom surface of the storage node contact 101*b*.

In the embodiments of the disclosure, the conductive layer 116 can improve the conductivity of the memory node contact 101*b*, and further reduce the contact resistance between the memory node contact 101*b* and the capacitor structure 40, thereby improving the electrical performances of the semiconductor structure 300.

In some embodiments, with continued reference to FIGS. 3B and 3C, the semiconductor structure 300 further includes a first heavy doped region 117. The first heavy doped region 117 is a region formed by performing the first heavy doping on the active pillar 101 inside the first semiconductor layer 105. In embodiments of the disclosure, the first heavy doping may be P-type doping on the active pillar 101. For example, the active pillar 101 is doped with trivalent impurity elements, such as boron, gallium, indium, or the like. The first heavy doped region 117 may serve as a conductive channel that allows holes accumulated in the channel of the transistor to enter the semiconductor substrate 100 through a manner of band to band tunneling, thereby avoiding the conduction of the parasitic triode, and improving the electrical properties of the semiconductor structure.

In some embodiments, with continued reference to FIGS. 3B and 3C, the semiconductor structure 300 further includes a drain D. The active pillar 101 located in a projection area of the second insulating layer 111 constitutes the drain D of the semiconductor structure.

Similar to the method for forming the semiconductor structure provided by the above-mentioned embodiments, with respect to the semiconductor structure provided by the embodiments of the disclosure, the technical features not disclosed in detail in the embodiments of the disclosure can be understood with reference to the above-mentioned embodiments, and thus will not be repeated here.

In the semiconductor structure provided by the embodiments of the disclosure, on the one hand, the transistor thereof is of a vertical structure, and thus the integration of the semiconductor structure can be improved to realize the miniature of the dimension of the semiconductor structure; on the other hand, since the band gap of the first semiconductor layer is smaller than the band gap of the active pillar, the hole current of the transistor is increased, and the potential barrier between the source and the semiconductor substrate is reduced, so that the holes accumulated in the channel of the transistor can be easily discharged, and the parasitic bipolar transistor effect is weakened, and the broken down voltage is increased, which can effectively suppress the floating body effect of the formed semiconductor structure.

In several embodiments provided by the present disclosure, it should be understood that the disclosed device and method may be implemented in a non-targeted manner. The embodiments of a device described above are only illustrative, for example, the division of units is only a logical function division, and can be implemented in other ways, for example, multiple units or components can be combined, or integrated into another system, or some features can be ignored or not implemented.

The features disclosed in the embodiments of several methods or devices provided in the disclosure can be arbitrarily combined as long as there is no conflict therebetween to obtain a new embodiment of a method or a device.

The descriptions above are only some embodiments of the present disclosure, and are not intended to limit the scope of protection of the embodiments of the present disclosure. Any change and replacement is easily to think within the technical scope of the embodiments of the present by those skilled in the art, and fall with the protection scope of the present disclosure. Therefore, the scope of protection of the embodiments of the present disclosure shall be subject to the scope of protection of the claims.

INDUSTRIAL PRACTICALITY

In the embodiments of the disclosure, the first semiconductor layer may serve as a source of the transistor. As the band gap of the first semiconductor layer is smaller than the band gap of the active pillar, the potential barrier between the source and the semiconductor substrate is reduced. Therefore, the holes accumulated in the channel can be easily discharged, and the parasitic bipolar transistor effect is weakened, thereby effectively suppressing the floating body effect of the formed semiconductor structure and improving the electrical performances and manufacture yield of the semiconductor structure.

What is claimed is:

1. A method for forming a semiconductor structure, comprising:
   providing a semiconductor substrate comprising a plurality of active pillars arranged at intervals;
   etching the active pillar to form an annular groove, wherein the annular groove does not expose a top surface and a bottom surface of the active pillar; and
   forming a first semiconductor layer in the annular groove to form the semiconductor structure; wherein a band gap of the first semiconductor layer is smaller than a band gap of the active pillar.

2. The method according to claim 1, wherein forming the first semiconductor layer in the annular groove to form the semiconductor structure comprises:
   performing a surface treatment on the first semiconductor layer to form a second semiconductor layer; and
   forming a bit line metal layer on a surface of the second semiconductor layer to form a bit line structure.

3. The method according to claim 2, wherein etching the active pillar to form the annular groove comprises:
   forming an isolation layer on a surface of the semiconductor substrate;
   forming a first sacrificial layer covering part of the active pillar on part of a surface of the isolation layer;
   forming a second sacrificial layer on the surface of the isolation layer, a surface of the first sacrificial layer and a surface of the active pillar;
   removing the first sacrificial layer to form a first groove; and
   etching part of the active pillar through the first groove to form the annular groove.

4. The method according to claim 3, wherein an etching selectivity ratio between the first sacrificial layer and the active pillar is greater than an etching selectivity ratio between the second sacrificial layer and the active pillar.

5. The method according to claim 3, further comprising:
   removing the second sacrificial layer, after the first semiconductor layer is formed and before the second semiconductor layer is formed.

6. The method according to claim 5, wherein performing the surface treatment on the first semiconductor layer to form the second semiconductor layer comprises:
   depositing a metal material on a surface of the first semiconductor layer to form a metal layer; and
   performing an annealing treatment on the metal layer and the first semiconductor layer to form the second semiconductor layer.

7. The method according to claim 1, further comprising:
   performing a first heavy doping on an unetched part of the active pillar located in a middle of the annular groove to form a first heavy doped region, before the first semiconductor layer is formed.

8. The method according to claim 7, further comprising:
   forming a gate-all-around structure, a storage node contact and a capacitor structure.

9. The method according to claim 8, wherein the gate-all-around structure is formed by following operations:
   forming a first insulating layer covering part of the active pillar in a gap between the bit line structures and on a surface of the bit line metal layer; and
   sequentially forming a gate oxide layer and a gate metal layer covering part of the active pillar on a surface of the first insulating layer to form the gate-all-around structure.

10. The method according to claim 9, further comprising:
    forming a second insulating layer covering part of the active pillar in a gap between the gate-all-around structures and on a surface of the gate oxide layer and a surface of the gate metal layer, after the gate-all-around structure is formed.

11. The method according to claim 10, wherein the storage node contact is formed by following operations:
    etching the active pillar to form a second groove and an annular pillar, a bottom surface of the second groove being flush with a top surface of the second insulating layer; and
    performing a second heavy doping on the annular to form the storage node contact; and
    optionally, the first heavy doping and the second heavy doping are opposite in doping type.

12. The method according to claim 11, further comprising:
    filling an insulating material in the second groove to form a third insulating layer; or, filling a conductive material in the second groove to form a conductive layer.

13. The method according to claim 12, wherein the capacitor structure is formed by following operations:
sequentially depositing a first electrode layer, a dielectric layer and a second electrode layer on surfaces of the storage node contact and the third insulating layer to form the capacitor structure;
alternatively, the capacitor structure is formed by following operations:
depositing a first electrode layer, a dielectric layer and a second electrode layer sequentially on surfaces of the storage node contact and the conductive layer to form the capacitor structure.

14. A semiconductor structure, comprising:
a semiconductor substrate formed with a plurality of active pillars arranged at intervals; wherein each of the active pillars comprises an annular groove, and the annular groove does not expose a top surface and a bottom surface of the active pillar; and
a first semiconductor layer located in the annular groove; wherein a band gap of the first semiconductor layer is smaller than a band gap of the active pillar.

15. The semiconductor structure according to claim 14, wherein the semiconductor structure further comprises a second semiconductor layer and a bit line metal layer;
wherein the second semiconductor layer is located on a surface of the first semiconductor layer, and the bit line metal layer is located on a surface of the second semiconductor layer.

16. The semiconductor structure according to claim 15, wherein the semiconductor structure further comprises a gate-all-around structure;
wherein the gate-all-around structure is located on a surface of part of the active pillar, and the gate-all-around structure comprises a gate oxide layer and a gate metal layer.

17. The semiconductor structure according to claim 16, wherein the semiconductor structure further comprises a first insulating layer and a second insulating layer;
wherein the first insulating layer is located on a surface of the bit line structure and in a gap between the bit line structures; and
the second insulating layer is located on a surface of the gate-all-around structure and in a gap between the gate-all-around structures.

18. The semiconductor structure according to claim 14, wherein the semiconductor structure further comprises a storage node contact and a capacitor structure;
wherein the capacitor structure is located on a surface of the storage node contact, and is electrically connected with the storage node contact.

19. The semiconductor structure according to claim 18, wherein the semiconductor structure further comprises a third insulating layer or a conductive layer;
wherein the third insulating layer is located inside the storage node contact, and a top surface of the third insulating layer is flush with a top surface of the storage node contact; and
wherein the conductive layer is located inside the storage node contact, and a top surface of the conductive layer is flush with a top surface of the storage node contact.

20. The semiconductor structure according to claim 19, wherein the semiconductor structure further comprises a first heavy doped region;
wherein the first heavy doped region is located inside the first semiconductor layer.

* * * * *